United States Patent
Yamamoto (10) Patent No.: US 7,598,007 B2
(45) Date of Patent: Oct. 6, 2009

(54) PATTERN TRANSFER MASK, FOCUS VARIATION MEASURING METHOD AND APPARATUS, AND SEMICONDUCTOR DEVICE MANUFACTURING METHOD

(75) Inventor: Tomohiko Yamamoto, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/043,197

(22) Filed: Mar. 6, 2008

(65) Prior Publication Data

US 2008/0153011 A1   Jun. 26, 2008

Related U.S. Application Data

(63) Continuation of application No. PCT/JP2005/016347, filed on Sep. 6, 2005.

(51) Int. Cl.
*G03F 9/00* (2006.01)
(52) U.S. Cl. ............................... 430/5; 430/30
(58) Field of Classification Search ............... 430/5, 430/30
See application file for complete search history.

(56) References Cited

U.S. PATENT DOCUMENTS

| | | | |
|---|---|---|---|
| 6,295,629 B1 | 9/2001 | Sunanaga | |
| 6,440,616 B1 | 8/2002 | Izuha et al. | |
| 7,175,943 B2 | 2/2007 | Asano et al. | |
| 7,250,235 B2 * | 7/2007 | Izuha et al. | 430/5 |
| 2004/0219439 A1 | 11/2004 | Asano et al. | |
| 2007/0105028 A1 | 5/2007 | Asano et al. | |

FOREIGN PATENT DOCUMENTS

| | | |
|---|---|---|
| JP | 10-154647 A | 6/1998 |
| JP | 11-102061 | 4/1999 |
| JP | 2000-133569 | 5/2000 |
| JP | 2001-189264 | 7/2001 |
| JP | 2001-274059 | 10/2001 |
| JP | 2004-184764 | 7/2004 |
| JP | 2004-253589 | 9/2004 |
| KR | 100169227 | 2/1999 |

OTHER PUBLICATIONS

International Search Report mailed Dec. 20, 2005, issued in corresponding International Application No. PCT/JP2005/016347.
Translation of International Preliminary Report on Patentability mailed Mar. 20, 2008 of International Application No. PCT/JP2005/016347.
"Korean Office Action", Partial English-language translation, mailed from KR Patent Office May 25, 2009 for corresponding KR Patent App. No. 2008-7004259.

* cited by examiner

*Primary Examiner*—Christopher G Young
(74) *Attorney, Agent, or Firm*—Fujitsu Patent Center (57) ABSTRACT

A reticle of the present invention has a main pattern (11) and a monitor pattern (12) each having a different thickness of a light-shielding film (4), the light-shielding film (4) of the monitor pattern (12) being formed thicker than that of the main pattern (11). Therefore, in a CD-focus curve, a focus center at which a focus value is the optimal value is shifted from the extremal value, so that a positive/negative direction of the focus is specified by monitoring the amount of shift using this shifted focus center. This configuration provides easy and highly accurate measurements of a focus error amount and the positive/negative direction of the focus. Ultimately, the measured focus error information is fed back to a next lot and is fed forward to a next process to manufacture a semiconductor device stably.

6 Claims, 11 Drawing Sheets

FIG. 15

PATTERN TRANSFER MASK, FOCUS VARIATION MEASURING METHOD AND APPARATUS, AND SEMICONDUCTOR DEVICE MANUFACTURING METHOD

TECHNICAL FIELD

The present invention relates to a pattern transfer mask used when forming a transfer pattern on a transfer object such as a wafer using an aligner, a focus variation measuring method and an apparatus for measuring a focus variation (focus error) in a lithography process for manufacturing a semiconductor device and a display device such as a liquid crystal, and a semiconductor device manufacturing method utilizing the focus variation measuring method.

BACKGROUND ART

Recently, along with highly improving density of a semiconductor element, a pattern formed by a lithography shows progress in microfabrication. The finer the pattern becomes, the smaller the requirement for size uniformity becomes. As one major cause that deteriorates the size uniformity, exposure errors of an aligner can be cited. Among the exposure errors, a focus error and an exposure amount error in particular become quite serious problems when manufacturing a device of, so-called 90 nm generation. When the focus error arises, for example, a size of an isolated pattern and the like having small depth of focus is inevitably formed small. It is said that for manufacturing a device of 90 nm generation, a focus control at a level of about ±50 nm is required.

Conventionally, the focus control in the aligner is performed in the following manner, as an example. First, a sample wafer is fabricated by adopting various focus values in on-condition maintenance and the like, the width of the isolated pattern or the like is measured using a CD-SEM or so forth, and thereafter, an optimal focus value is determined by drawing a CD-focus curve. Then, the result is stored on the side of the aligner as an offset value to thereby control the focus.

Further, as another actual example of a so-called in-line focus monitor technique, the following are disclosed. In Patent Document 1, there is disclosed a technique for measuring a focus error amount in which a relation between an angle of gradient of an edge and a focus position both of a resist pattern is obtained to thereby calculate a taper angle of the resist pattern formed on a wafer. In Patent Document 2, there is disclosed a technique for measuring a focus value in which a focus value is measured by measuring a length of a resist pattern in the longitudinal direction using a dedicated mask and a variation amount in thickness of the resist. In Patent Document 3, there is disclosed a technique for measuring a focus error amount using a reticle having a shape formed by digging a quartz substrate.

Patent Document 1: Japanese Patent Application Laid-Open No. Hei 10-154647
Patent Document 2: Japanese Patent Application Laid-Open No. 2000-133569
Patent Document 3: Japanese Patent Application Laid-Open No. 2004-184764

The focus control of the technique disclosed in the Patent Document 1 and the like requires long hours to measure a pattern size, so that the control by a time unit less than one day is difficult. Still more, it is impossible to monitor the focus variation by a time unit of several hours or less than that. In addition, in the course of a normal processing of products, no such a processing in which the focus varies in the wafer or in a lot is performed, so that a focus control using a product wafer is considered to be impossible.

Further, in the in-line focus monitor technique disclosed at present in Patent Document 2 and the like, the detectable focus variation cannot satisfy a required accuracy, causing a problem that measurement repeatability and measurement accuracy are not improved in the measurement using the CD-SEM. As a consequence, a focus monitor with high accuracy is unable to be performed.

Furthermore, in the technique disclosed in Patent Document 3 and the like, not only an algorithm for performing the focus monitor but also a process for manufacturing a reticle are complicated, so that the cost of the reticle inevitably increases significantly.

SUMMARY

According to an aspect of an embodiment, there is a pattern transfer mask has: a main pattern region composed of a main pattern to be transfer-formed on a transfer object; and a monitor pattern region composed of a monitor pattern for calculating a focus variation amount when the main pattern is transfer-formed, in which the main pattern and the monitor pattern are formed with mutually different height values.

According to another aspect of an embodiment, there is a focus variation measuring method for measuring a focus variation of a main pattern when the main pattern is transferred on a transfer object, the focus variation measuring method has: a first step for transferring a monitor pattern on the transfer object using a pattern transfer mask having a main pattern region composed of the main pattern and a monitor pattern region composed of the monitor pattern for calculating a focus variation amount when the main pattern is transferred, the main pattern and the monitor pattern being formed with mutually different height values; a second step for measuring a size of the transferred monitor pattern; and a third step for calculating a focus variation amount of the main pattern and specifying a positive/negative direction of the focus variation of the main pattern based on a size measurement value of the transferred monitor pattern obtained at the second step, by referring a first relation indicating a relation between size measurement values of a transferred main pattern having the main pattern transferred thereon and focus variation values, and a second relation indicating a relation between size measurement values of the transferred monitor pattern and focus variation values, both relations being prepared in advance.

According to another aspect of an embodiment, there is a semiconductor device manufacturing method of the present invention has: a first step for transferring a monitor pattern on a transfer object using a pattern transfer mask having a main pattern region composed of a main pattern to be transfer-formed on the transfer object and a monitor pattern region composed of the monitor pattern for calculating a focus error amount when the main pattern is transfer-formed, the main pattern and the monitor pattern being formed with mutually different height values; a second step for measuring a size of the transferred monitor pattern; a third step for calculating a focus variation amount of the main pattern and specifying a positive/negative direction of the focus variation of the main pattern based on a size measurement value of the transferred monitor pattern obtained at the second step, by referring a first relation indicating a relation between size measurement values of a transferred main pattern having the main pattern transferred thereon and focus variation values, and a second relation indicating a relation between size measurement values of the transferred monitor pattern and focus variation values, both relations being prepared in advance; and a forth step for determining whether or not the calculated focus variation amount meets a standard, in which if the focus variation amount is determined to meet the standard, a procedure goes to a next step and if the focus variation amount is determined to be out of the standard, the plurality of transferred patterns are removed, and thereafter, the focus variation amount and the positive/negative direction of the focus variation measured at the third step are reflected to the first step, and the first to fourth steps are reexecuted.

BEST MODES FOR CARRYING OUT THE INVENTION

Basic Gist of Present Invention

Figure 1A:
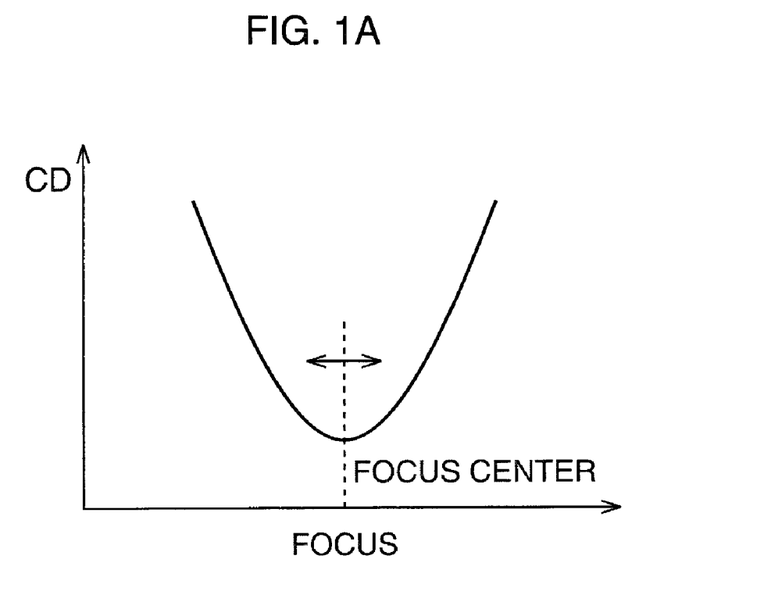
FIG. 1A is a characteristic chart showing an example of a CD-focus curve.

Generally, a relation between focus offset values and size measurement values of a transferred pattern is expressed in a so-called CD-focus curve approximated by an even-number order function. An example of the CD-focus curve is shown in FIG. 1A. In this case, an extremal value of the focus offset values becomes an optimal focus value, that is, a focus center. Here, a distance between a pair of transferred patterns is set to be a size measurement value of the transferred pattern, so that the extremal value of the focus offset values is the minimum value. As described above, since the CD-focus curve is approximated by, for example, a second-order function, when a focus error arises, it is difficult to determine a displacement from the extremal value to be of positive or negative. Further, a variation amount of the size measurement value with respect to that of the focus is quite small in the vicinity of focus center, accordingly, even when the size measurement value varies, it is impossible to measure the focus error with high sensitivity.

Figure 1B:
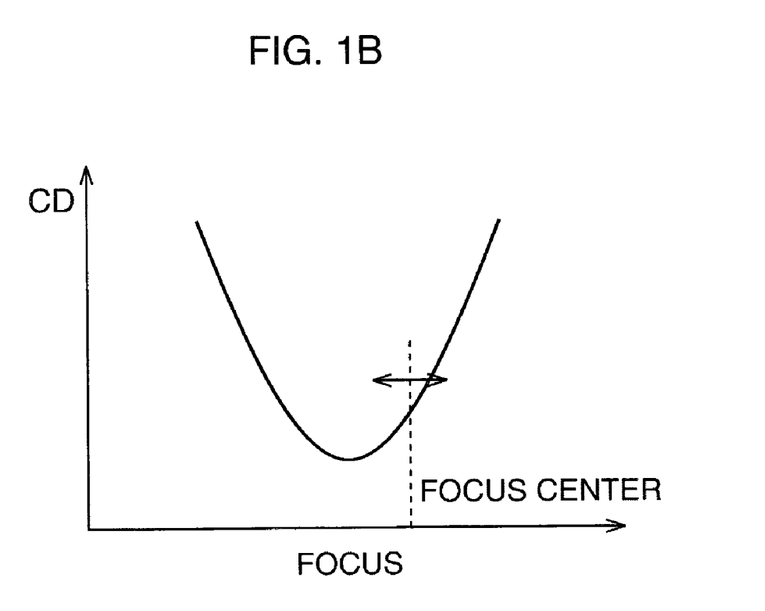
FIG. 1B is a characteristic chart showing an example of a CD-focus curve according to the present invention.

In view of the above-described fact, it is possible to specify a positive/negative direction of the focus if the focus center at which the focus value becomes the optimal value is intentionally shifted from the extremal value in the CD-focus curve as shown in FIG. 1B, for example, and the shifted amount is monitored using the shifted focus center. In this case, as the shifted amount of focus center from the extremal value becomes larger, the variation amount of size measurement value with respect to that of the focus becomes large. Accordingly, the focus error can be measured with high sensitivity.

In order to shift the focus center from the extremal value as described above, it is only needed to form a pattern transfer mask (photo mask and the like: reticle, for example) in which a monitor pattern and a main pattern are designed to have different image locations on a transfer object. The present invention proposes a pattern transfer mask in which a height of the monitor pattern in a monitor pattern region is different from that of the main pattern in a main pattern region.

Figure 2A:
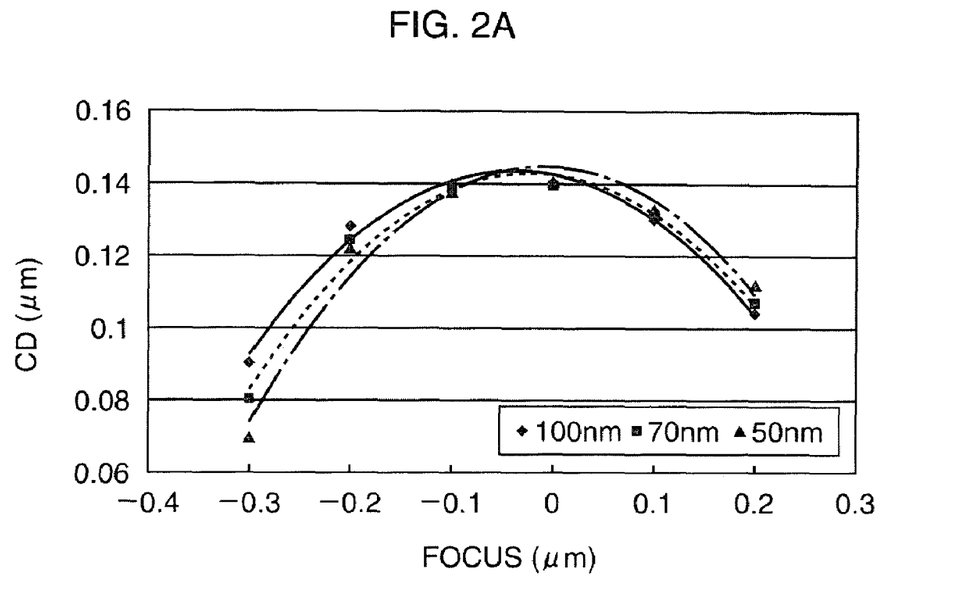
FIG. 2A is a characteristic chart showing a relation between focus offset values of an isolated pattern and CD values.

Here, the pattern transfer mask having patterns with different heights is used to form a transferred pattern, and a relation between focus offset values and width measurement values (CD values) of the transferred pattern is examined. As a pattern for the pattern transfer mask, a so-called isolated pattern is transferred on a resist on a wafer and a line width of the transferred pattern is measured. The measurement results are shown in FIG. 2A. FIG. 2A indicates the results when respectively measuring the relation between the focus offset values and the CD values while varying the heights of the transferred pattern (in this case, thicknesses of chromium (Cr) film as a light-shielding film). Here, the thicknesses of the light-shielding film are set to be three values of 100 nm, 70 nm and 50 nm. As the light-shielding film becomes thinner, the focus center shifts to the right side, as ascertained in the drawing.

Figure 2B:
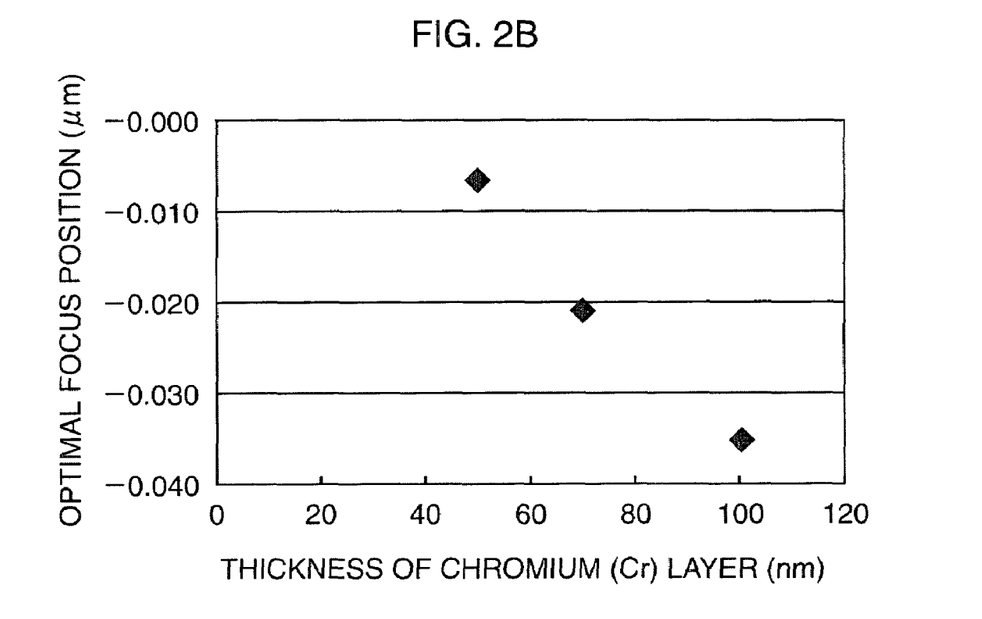
FIG. 2B is a characteristic chart showing a relation between thicknesses of a light-shielding film and extremal values (here, maximum values) of CD-focus curves.

Next, a relation between the thicknesses of the light-shielding film and the extremal values (here, the maximum values) of the CD-focus curves is examined based on the measurement results of FIG. 2A. The measurement results are shown in FIG. 2B. As the light-shielding film becomes thicker, an optimal focus position shifts to the negative side, as confirmed in the drawing. Specifically, when the light-shielding film of the main pattern and the monitor pattern is differed in thickness of about 50 nm, for example, there is generated a difference in optimal focus positions as much as 30 nm. It can be understood that the measurement of focus error amount can be conducted easily as much as the corresponding difference, and simultaneously the specification of positive/negative direction of the focus error can also be performed easily.

In the present invention, the specified positive/negative direction of the focus error as well as the calculated focus error amount are fed back to a lot composed of the next respective transfer objects or the plurality of transfer objects, and further be fed forward to a next process following a patterning process. Accordingly, an accurate patterning can be realized and the next and following processes can be optimized.

Specific Embodiments of the Present Invention

Hereinafter, specific embodiments adopting the present invention will be described in detail with reference to the drawings.

[Structure of Reticle]

Figure 3A:
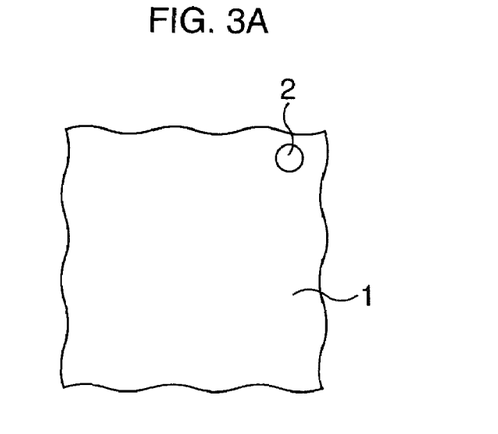
FIG. 3A is a schematic plan view showing a main structure of a reticle.
Figure 3B:
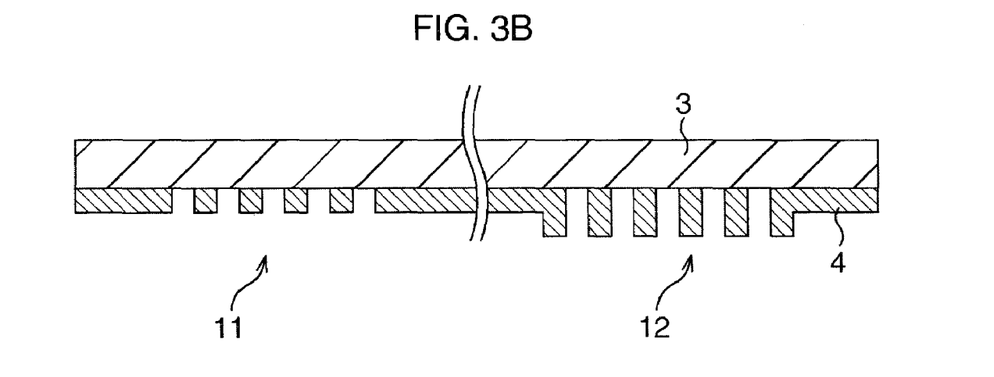
FIG. 3B is a schematic sectional view showing the main structure of the reticle.
Figure 3C:
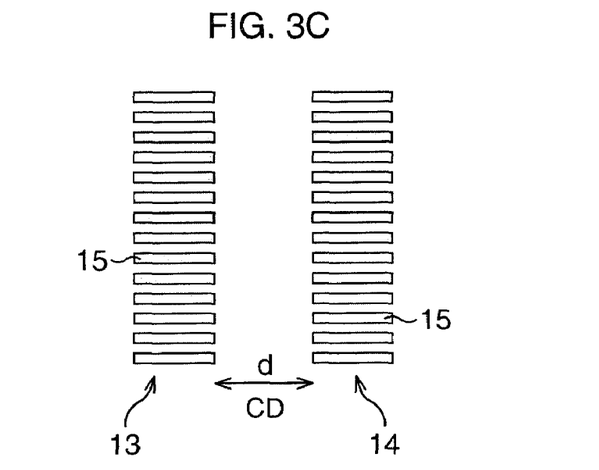
FIG. 3C is a schematic plan view showing a state that a monitor pattern is transferred.

Schematic structures of a pattern transfer mask, a reticle in this case, according to the present embodiment are shown in FIG. 3A to FIG. 3C. Here, FIG. 3A is a schematic plan view showing a main structure of the reticle, FIG. 3B is a schematic sectional view showing the main structure of the reticle, and FIG. 3C is a schematic plan view showing a state that a monitor pattern is transferred.

The reticle of the present embodiment is provided with a main pattern region 1 composed of a desired main pattern and a monitor pattern region 2 composed of a monitor pattern for calculating a focus error amount when the main pattern is transfer-formed, as shown in FIG. 3A.

A main pattern 11 and a monitor pattern 12 are formed by patterning a light-shielding film 4 formed on a quartz substrate 3, as shown in FIG. 3B, for example. Here, the main pattern 11 and the monitor pattern 12 are formed with mutually different height values. Concretely, the main pattern 11 and the monitor pattern 12 have different thicknesses of the light-shielding film 4, in which the monitor pattern 12 is formed thicker compared to the main pattern 11. For instance, the main pattern 11 and the monitor pattern 12 are respectively formed to have about 50 nm and 100 nm in thickness, so that the difference in thickness of both patterns is set to be about 50 nm.

FIG. 3C shows a state that the monitor pattern 12 is transferred on a resist on a wafer.

A pair of transferred monitor pattern groups 13 and 14 is transfer-formed, as seen in the drawing. The transferred monitor pattern groups 13 and 14 are respectively composed of linear patterns 15 lined in parallel. Here, a distance "d" between the transferred monitor pattern groups 13 and 14 is measured as a size of the transferred monitor pattern, and is set as a size measurement value (CD value).

[Manufacturing Method of Reticle]

Figure 4A:
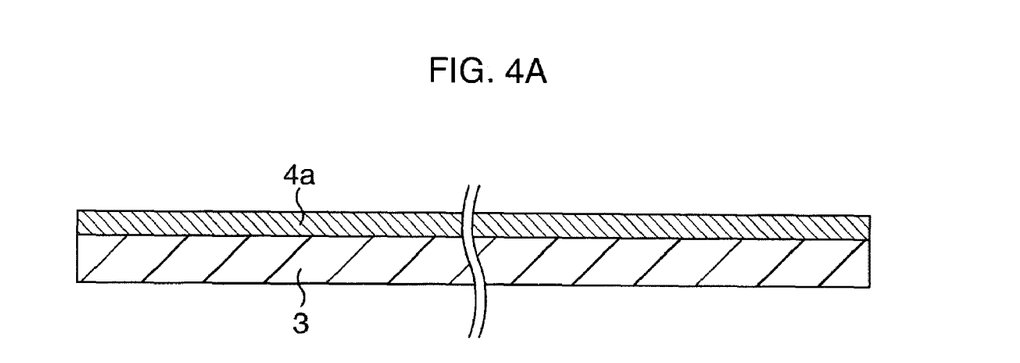
FIG. 4A is a schematic sectional view showing a manufacturing method of a reticle according to the present embodiment in order of step.
Figure 4B:
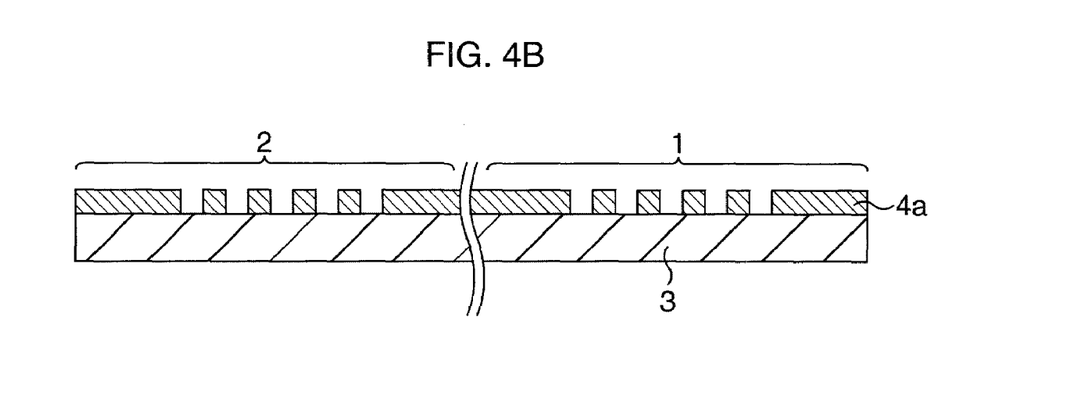
FIG. 4B is a schematic sectional view showing the manufacturing method of the reticle according to the present embodiment in order of step following FIG. 4A.
Figure 4C:
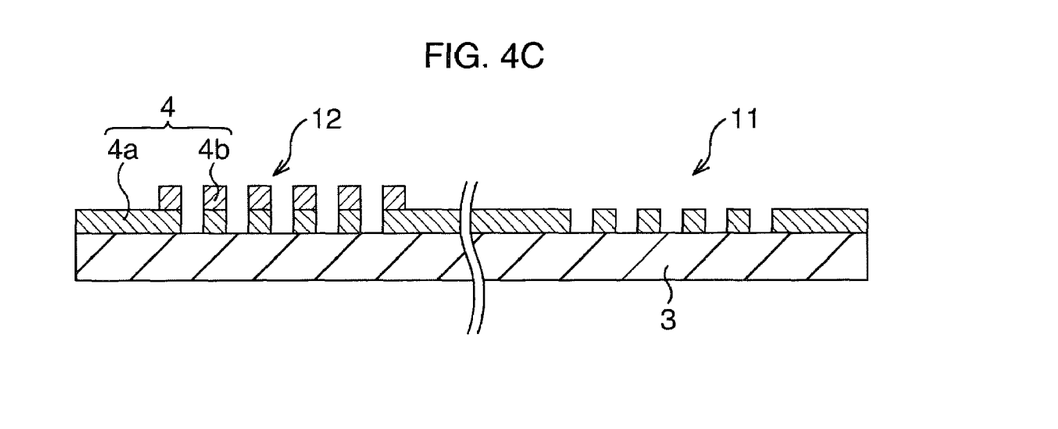
FIG. 4C is a schematic sectional view showing the manufacturing method of the reticle according to the present embodiment in order of step following FIG. 4B.

An example of a manufacturing method of the above-described reticle will be explained. FIG. 4A to FIG. 4C are schematic sectional views showing a manufacturing method of the reticle according to the present embodiment in order of step.

First, a quartz substrate 3, for instance, is prepared and a chromium (Cr) film 4a, for example, is deposited on a surface of the quartz substrate 3 to have, for example, 50 nm in film thickness by sputtering method and the like, as shown in FIG. 4A.

Next, a main pattern region 1 and a monitor pattern region 2 of the chromium (Cr) film 4a are respectively patterned, as shown in FIG. 4B. As for the main pattern region 1, a main pattern 11 is completed at this time.

Subsequently, upon the patterned portions of the monitor pattern region 2, a material being similar to chromium (Cr) such as carbon (C) 4b is deposited to have, for instance, 50 nm in film thickness by, for example, FIB (focused ion beam) method. At this time, the carbon (C) 4b is deposited on the patterned portions of the chromium (Cr) film 4a in the monitor pattern region 2 to thereby complete the monitor pattern 12. In the present embodiment, the chromium (Cr) film 4a and the carbon (C) 4b compose a light-shielding film 4.

[Principle for Measuring Focus Error Using Reticle]

A principle for measuring a focus error using the above-described reticle will be explained.

The reticle has the main pattern 11 and the monitor pattern 12 formed with different thicknesses, so that image locations of both patterns on a resist surface on a wafer become different.

Figure 5:
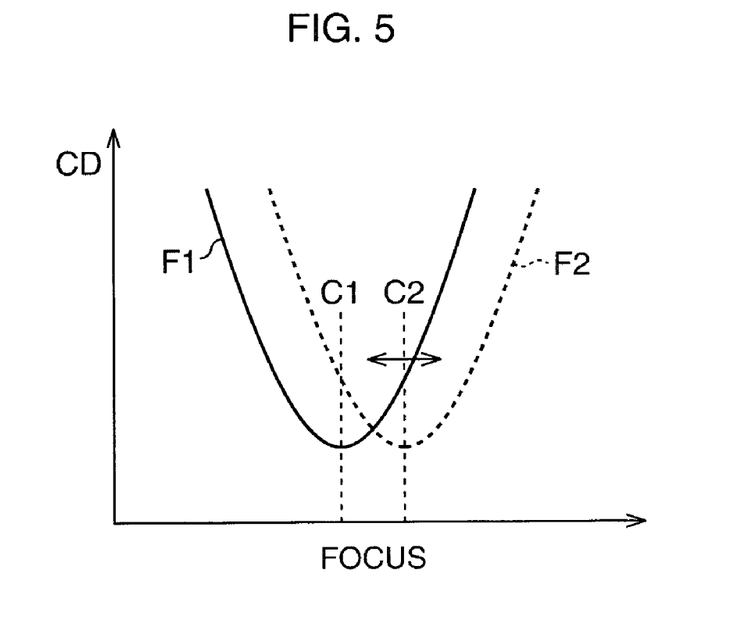
FIG. 5 is a characteristic chart showing an example of a CD-focus curve according to the present embodiment.

Here, since the monitor pattern 12 is formed thicker than the main pattern 11, a CD-focus curve F2 of the monitor pattern 12 shifts to the right side with regard to a CD-focus curve F1 of the main pattern 11, as shown in FIG. 5.

By applying the above-described characteristic, the present embodiment prepares the CD-focus curves F1 and F2 in advance, in which a value in the CD-focus curve F1 corresponding to a value C2 being a focus center in the CD-focus curve F2 is considered as a focus center C1 in the CD-focus curve F1. Subsequently, with the use of the focus center C1, the CD values in the CD-focus curve F2 are converted into the CD values in the CD-focus curve F1 to monitor the focus error amount. Accordingly, it is possible to specify not only the focus error amount but also a positive/negative direction of the focus. Specifically, when the size measurement value is larger than the CD value of the focus center C1, the focus takes positive direction, on the other hand, when it is smaller than the CD value of the focus center C1, the focus takes negative direction. In this case, since the focus center C1 is shifted from the minimum value of the CD-focus curve F1, the variation amount of the focus with regard to the variation of the size measurement value becomes larger than that of in the vicinity of the minimum value. Accordingly, the sensitivity for measuring the focus error amount is improved.

[Structure of Focus Error Measuring Apparatus]

Figure 6:
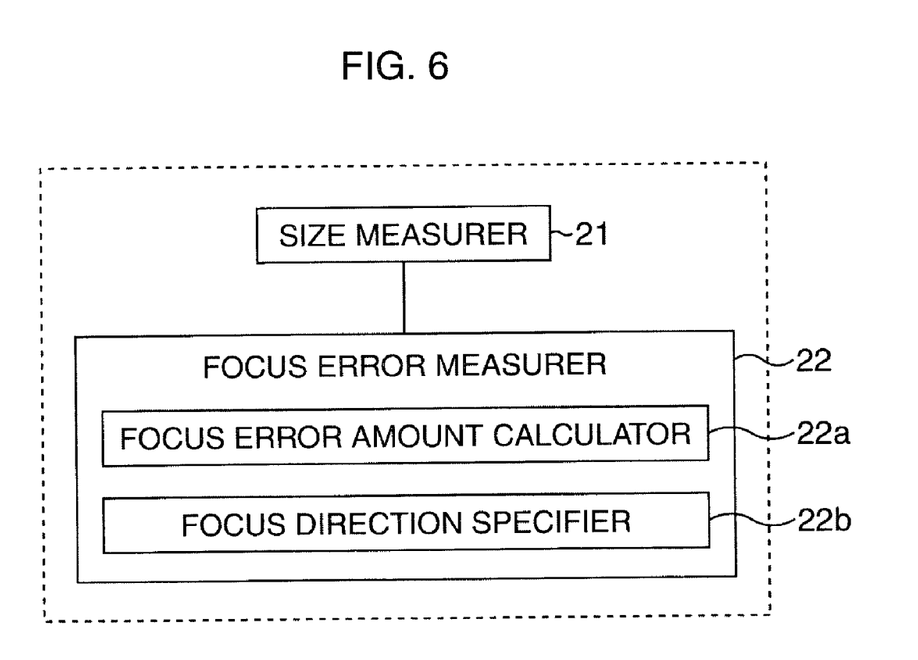
FIG. 6 is a block diagram showing a schematic structure of a focus error measuring apparatus according to the present embodiment.

FIG. 6 is a block diagram showing a schematic structure of a focus error measuring apparatus according to the present embodiment. In the focus error measuring apparatus, a reticle composed as shown in FIG. 2, for example, is used for measuring a focus error.

The focus error measuring apparatus is provided with a size measurer 21 and a focus error measurer 22.

The size measurer 21 is for measuring a size of a transferred monitor pattern having, for example, a monitor pattern 12 transferred thereon, and is a measuring apparatus of various types that enables a highly accurate measurement, such as an electron microscope, an atomic force microscope, an optical width measuring apparatus, or the like.

The focus error measurer 22 is provided with a focus error amount calculator 22a calculating a focus error amount of a main pattern 11 based on a size measurement value of the transferred monitor pattern referring the CD-focus curves F1 and F2, and a focus direction specifier specifying a positive/negative direction of the focus of the main pattern 11, also based on the size measurement value. Here, various data regarding the CD-focus curves F1 and F2 are, for example, compiled into database to be stored. The focus error measurer 22 determines the focus error amount and the positive/negative direction of the focus of the main pattern 11 using this database.

[Focus Error Measuring Method]

Figure 7:
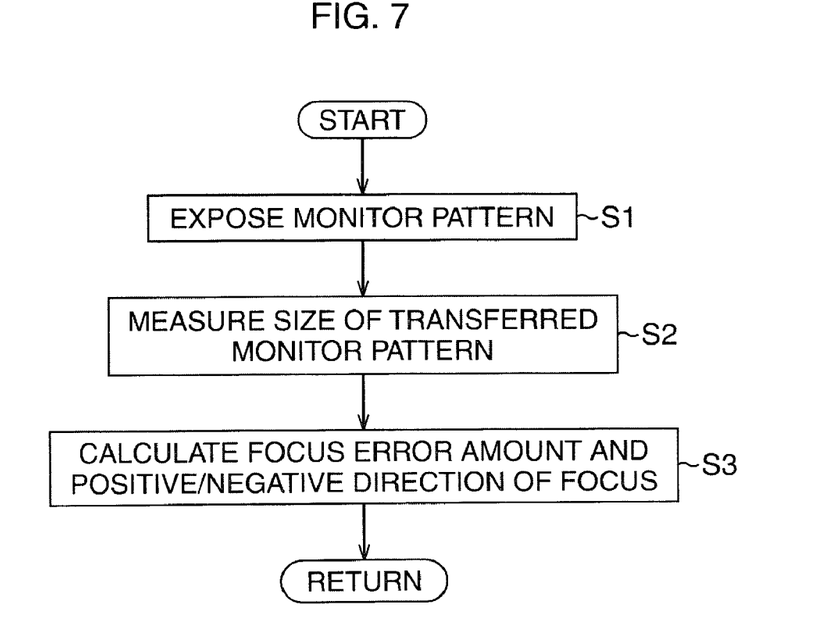
FIG. 7 is a flow chart showing a focus error measuring method in order of step using the focus error measuring apparatus.

FIG. 7 is a flow chart showing a focus error measuring method in order of step using the above-described focus error measuring apparatus.

First, with the use of a desired aligner, a monitor pattern 12 of a reticle shown in FIG. 2, for example, is exposed on a resist surface formed on a wafer (step S1).

Next, the size measurer 21 measures a size of the transferred monitor pattern having the monitor pattern 12 transferred thereon (step S2). Here, a distance between a pair of transferred monitor patterns 13 and 14 shown in FIG. 3C, for instance, is set to be a size measurement value.

Subsequently, the focus error measurer 22 reads out data regarding the CD-focus curves F1 and F2 being stored, for example, in the database, calculates a focus error amount of the main pattern 11 and specifies a positive/negative direction of the focus error of the main pattern 11 based on the size measurement value of the transferred monitor patterns 13 and 14 (step S3).

[Semiconductor Device Manufacturing Method]

According to the present embodiment, in the lithography process, as described above, by knowing information on the focus error amount, positive/negative direction of the focus error, exposure error amount and focus gradient error amount (hereinafter collectively referred to as "variation amount", for the sake of description) and by making use of the information, a desired pattern formation is performed with high accuracy.

Figure 8:
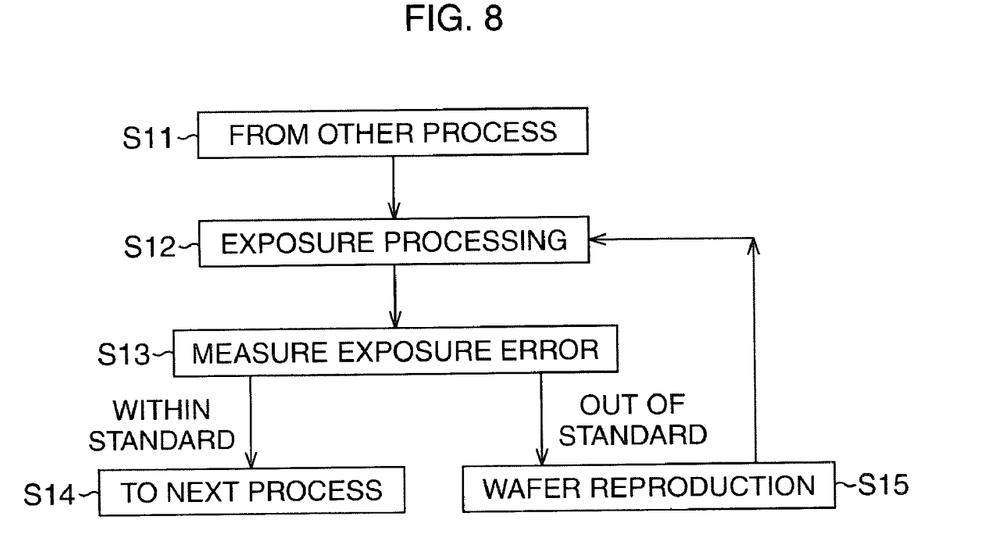
FIG. 8 is a flow chart showing a semiconductor device manufacturing method according to the present embodiment.

FIG. 8 is a flowchart showing a semiconductor device manufacturing method according to the present embodiment.

First, a lot, which comes from step S11 being a preceding process (photo mask producing process, wafer producing process, and so forth), is placed under an exposure processing (step S12).

Subsequently, the above-described variation amount is measured (step S13). Here, the focus error amount and positive/negative direction of the focus error are calculated through the steps S1 to S3 shown in FIG. 7. Further, the exposure error amount can be calculated by using the pair of transferred monitor patterns 13 and 14 shown in FIG. 3C and reversal patterns thereof (specifically, patterns formed in a groove shape on portions corresponding to the transferred monitor patterns 13 and 14). Furthermore, when a focus error occurred at four corners in a shot is clarified, the focus gradient error amount can be detected by calculating focus gradient components of the shot.

As a result, when the variation amount is determined to meet a standard, a procedure goes to a next step (assembling process and so forth including dicing) (step S14), and when the variation amount is determined to be out of the standard, the resist is peeled and the exposure processing is performed again (step S15). For this reprocessing, the variation amount out of the standard is fed back and controlled, and then the exposure processing is conducted. According to the feed back process, the pattern formation with quite high accuracy can be performed. When result shows no problem, it is possible to go to the next step. By performing such procedures, a product yield is expected to be improved substantially.

As described above, according to the present embodiment, it is enabled to measure the focus error amount and positive/negative direction of the focus easily with high accuracy. Further, by reflecting the resulting focus error to a next lot or a next process, a fine pattern can be formed with high accuracy.

MODIFIED EXAMPLES

Hereinafter, various modified examples according to the present embodiment will be explained.

The modified examples differ from the present embodiment in a structure of a reticle. Note that the same reference numerals and symbols are used to designate substantially the same constituent elements as the present embodiment, and detailed description thereof will be omitted.

Modified Example 1

Structure of Reticle

Figure 9:
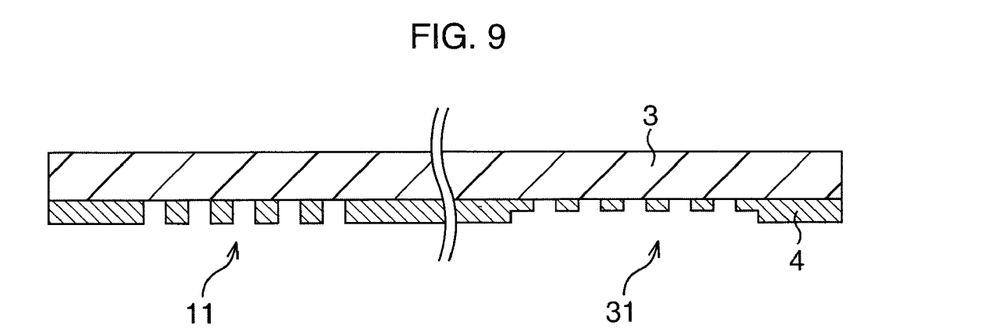
FIG. 9 is a schematic sectional view showing a main structure of a reticle according to a modified example 1 of the present embodiment.

FIG. 9 is a schematic sectional view showing a main structure of a reticle according to a modified example 1 of the present embodiment.

A reticle of the example has a main pattern 11 and a monitor pattern 31 formed by patterning a light-shielding film 4 formed on a quartz substrate 3. Here, the main pattern 11 and the monitor pattern 31 are formed with mutually different height values. Concretely, the main pattern 11 and the monitor pattern 31 have different thicknesses of the light-shielding film 4, in which the monitor pattern 31 is formed thinner compared to the main pattern 11. For instance, the main pattern 11 and the monitor pattern 31 are respectively formed to have about 100 nm and 50 nm in thickness, so that the difference in thickness of both patterns is set to be about 50 nm.

[Manufacturing Method of Reticle]

Figure 10A:
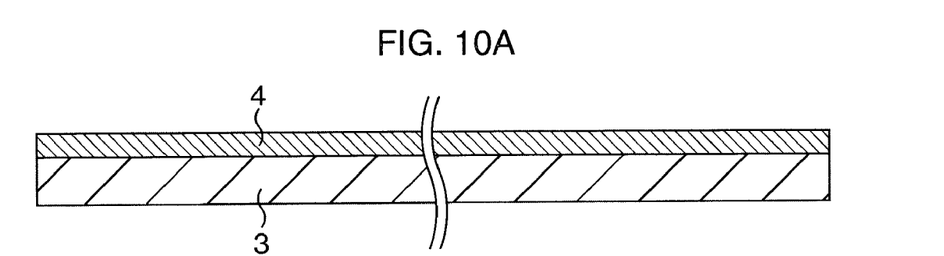
FIG. 10A is a schematic sectional view showing a manufacturing method of a reticle according to the modified example 1.
Figure 10B:
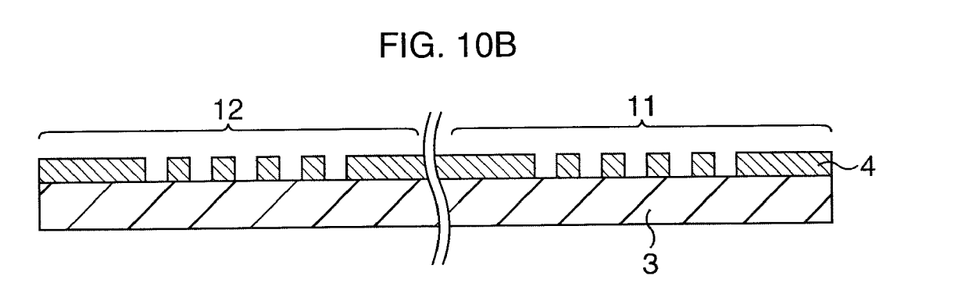
FIG. 10B is a schematic sectional view showing the manufacturing method of the reticle according to the modified example 1 in order of step following FIG. 10A.
Figure 10C:
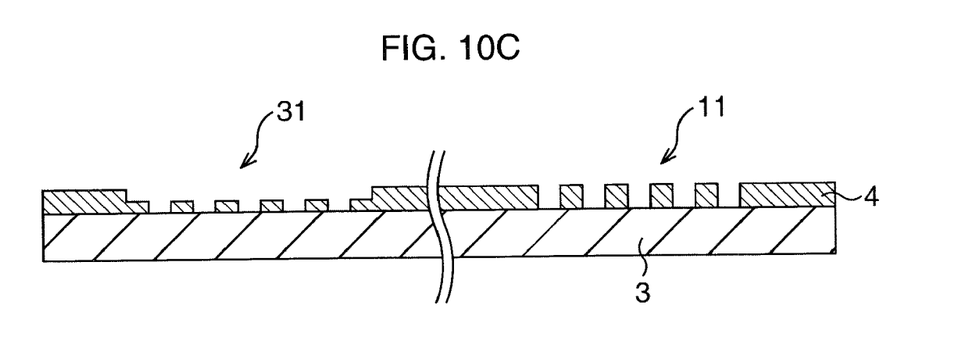
FIG. 10C is a schematic sectional view showing the manufacturing method of the reticle according to the modified example 1 in order of step following FIG. 10B.

An example of a manufacturing method of the above-described reticle will be explained. FIG. 10A to FIG. 10C are schematic sectional views showing a manufacturing method of the reticle according to the modified example 1 in order of step.

First, a quartz substrate 3, for instance, is prepared and a light-shielding film 4 formed of, for example, a chromium (Cr) film is deposited on a surface of the quartz substrate 3 to have, for example, 100 nm in film thickness by sputtering method and the like, as shown in FIG. 10A.

Next, a main pattern region 1 and a monitor pattern region 2 of the light-shielding film 4 are respectively patterned, as shown in FIG. 10B. As for the main pattern region 1, a main pattern 11 is completed at this time.

Subsequently, the light-shielding film 4 at the patterned portions of the monitor pattern region 2 is shaved as much as about 50 nm by, for example, FIB (focused ion beam) method. At this time, a monitor pattern 31 having the light-shielding film 4 processed to have about 50 nm in height is completed in the monitor pattern region 2.

According to the modified example 1, it is enabled to measure the focus error amount and positive/negative direction of the focus easily with high accuracy. Further, by reflecting the resulting focus error to a next lot or a next process, a fine pattern can be formed with high accuracy.

Modified Example 2

Structure of Reticle

Figure 11:
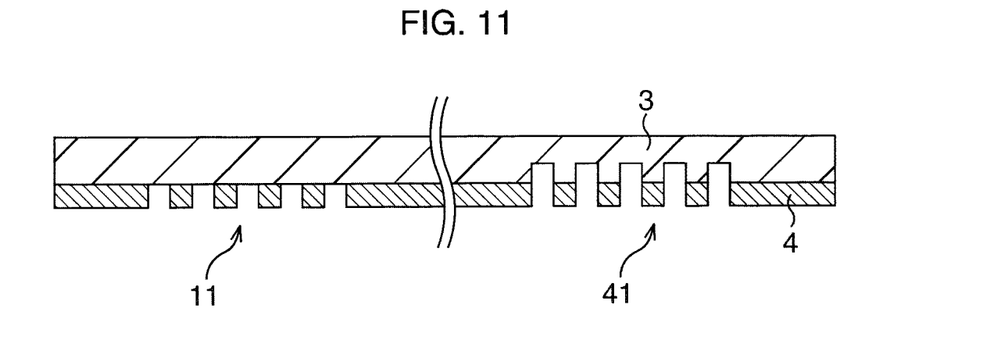
FIG. 11 is a schematic sectional view showing a main structure of a reticle according to a modified example 2 of the present embodiment.

FIG. 11 is a schematic sectional view showing a main structure of a reticle according to a modified example 2 of the present embodiment.

A reticle of the example has a main pattern 11 and a monitor pattern 41 formed by patterning a quartz substrate 3 and a light-shielding film 4 formed on the quartz substrate 3. Here, the main pattern 11 and the monitor pattern 41 are formed with mutually different height values. Concretely, the main pattern 11 and the monitor pattern 41 have the same thickness of the light-shielding film 4, but, in the monitor pattern 41, not only the light-shielding film 4 but also the quartz substrate 3 are processed together so that the monitor pattern 41 is formed higher (deeper) compared to the main pattern 11. For instance, the main pattern 11 and the monitor pattern 41 are respectively formed to have about 50 nm and 100 nm in height, so that the difference in height (depth) of both patterns is set to be about 50 nm.

[Manufacturing Method of Reticle]

Figure 12A:
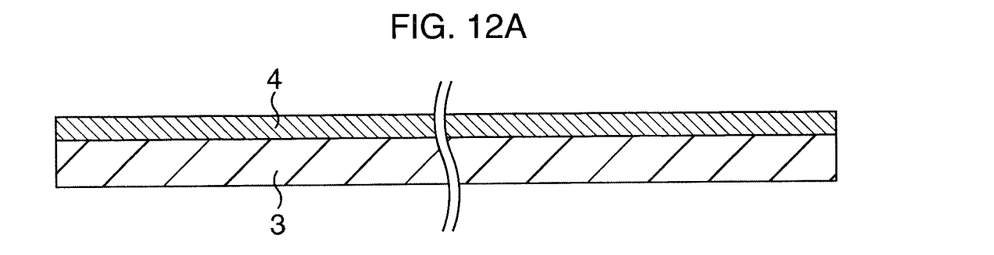
FIG. 12A is a schematic sectional view showing a manufacturing method of a reticle according to the modified example 2 in order of step.
Figure 12B:
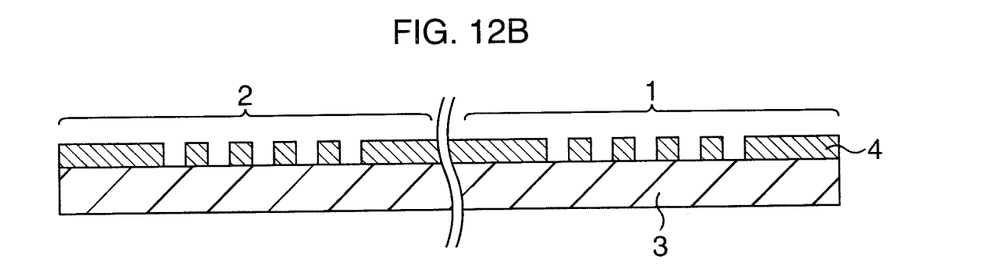
FIG. 12B is a schematic sectional view showing the manufacturing method of the reticle according to the modified example 2 in order of step following FIG. 12A.
Figure 12C:
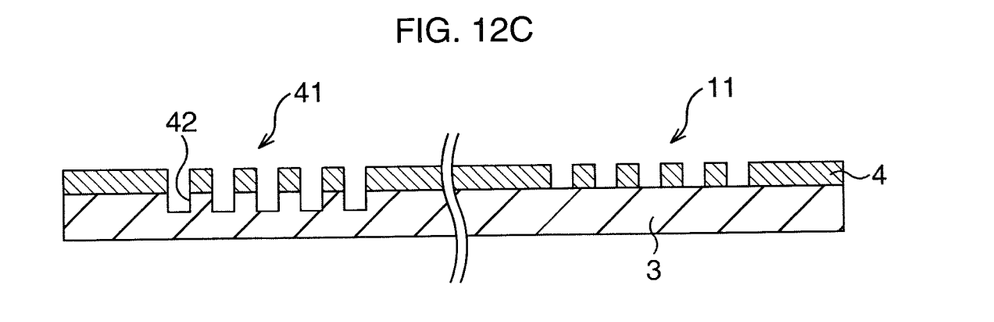
FIG. 12C is a schematic sectional view showing the manufacturing method of the reticle according to the modified example 2 in order of step following FIG. 12B.

An example of a manufacturing method of the above-described reticle will be explained. FIG. 12A to FIG. 12C are schematic sectional views showing a manufacturing method of the reticle according to the modified example 2 in order of step.

First, a quartz substrate 3, for instance, is prepared and as a light-shielding film 4, a chromium (Cr) film, for example, is deposited on a surface of the quartz substrate 3 to have, for example, about 50 nm in film thickness by sputtering method and the like, as shown in FIG. 12A.

Next, a main pattern region 1 and a monitor pattern region 2 of the light-shielding film 4 are respectively patterned, as shown in FIG. 12B. As for the main pattern region 1, a main pattern 11 is completed at this time.

Subsequently, the quartz substrate 3 at the patterned portions of the monitor pattern region 2 is shaved by, for example, FIB (focused ion beam) method, as shown in FIG. 12C. At this time, grooves 42 are formed on the quartz substrate 3 in accordance with the patterning of the light-shielding film 4, to thereby complete the monitor pattern 41. Here, the grooves 42 may be formed by performing wet etching on the quartz substrate 3 with the light-shielding film 4 as a mask using fluorine etching solution, instead of conducting the FIB (focused ion beam) method. Further, it is also suitable to form the grooves 42 by performing dry etching on the quartz substrate 3 with the light-shielding film 4 as a mask using chlorine etching solution.

According to the modified example 2, it is enabled to measure the focus error amount and positive/negative direction of the focus easily with high accuracy. Further, by reflecting the resulting focus error to a next lot or a next process, a fine pattern can be formed with high accuracy.

Modified Example 3

Structure of Reticle

Figure 13:
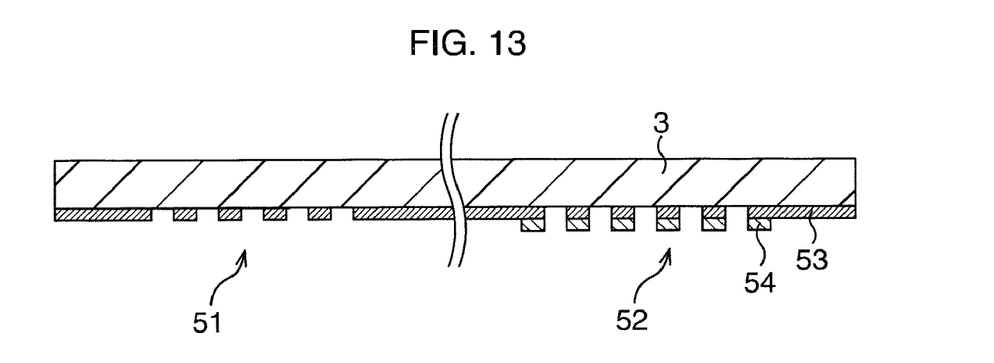
FIG. 13 is a schematic sectional view showing a main structure of a reticle according to a modified example 3 of the present embodiment.

FIG. 13 is a schematic sectional view showing a main structure of a reticle, a half tone type phase shift mask at this time, according to a modified example 3 of the present embodiment.

A half tone mask of the example has a main pattern 51 and a monitor pattern 52 formed by patterning a half tone film 53 and a chromium (Cr) film 54 formed on a quartz substrate 3. Here, the main pattern 51 and the monitor pattern 52 are formed with mutually different height values. Concretely, the main pattern 51 and the monitor pattern 52 differ in thickness as much as the thickness of the chromium (Cr) film 54, in which the monitor pattern 52 is formed thicker compared to the main pattern 51. For instance, the main pattern 51 and the monitor pattern 52 are respectively formed to have about 50 nm and 100 nm in thickness, so that the difference in thickness of both patterns is set to be about 50 nm.

[Manufacturing Method of Reticle]

An example of a manufacturing method of the above-described reticle will be explained. FIG. 14A to FIG. 14E are schematic sectional views showing a manufacturing method of the reticle according to the modified example 3 in order of step.

Figure 14A:
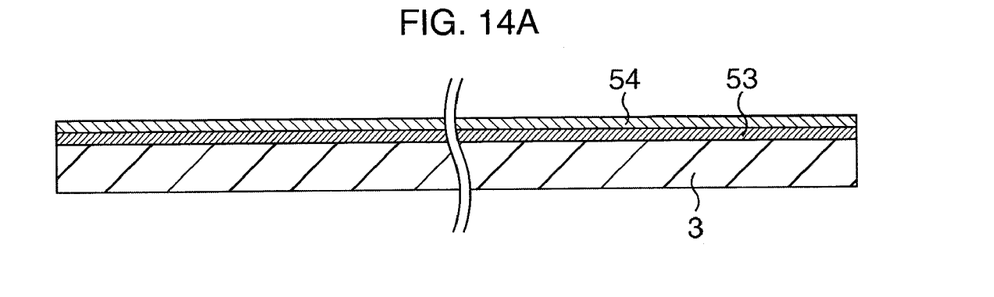
FIG. 14A is a schematic sectional view showing a manufacturing method of a reticle according to the modified example 3 in order of step.

First, a quartz substrate 3, for instance, is prepared and molybdenum silicide (MoSi), for example, is deposited on a surface of the quartz substrate 3 to have, for example, about 50 nm in film thickness by sputtering method and the like, to thereby form a half tone film 53, as shown in FIG. 14A. Next, a chromium (Cr) film 54 is deposited on the half tone film 53 to have, for example, about 50 nm in film thickness by sputtering method and the like.

Figure 14B:
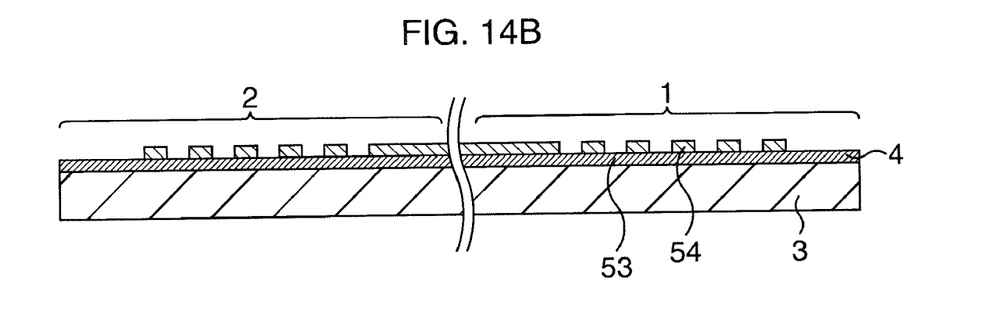
FIG. 14B is a schematic sectional view showing the manufacturing method of the reticle according to the modified example 3 in order of step following FIG. 14A.

Next, a main pattern region 1 and a monitor pattern region 2 of the chromium (Cr) film 54 are respectively patterned using a first exposure data, as shown in FIG. 14B.

Figure 14C:
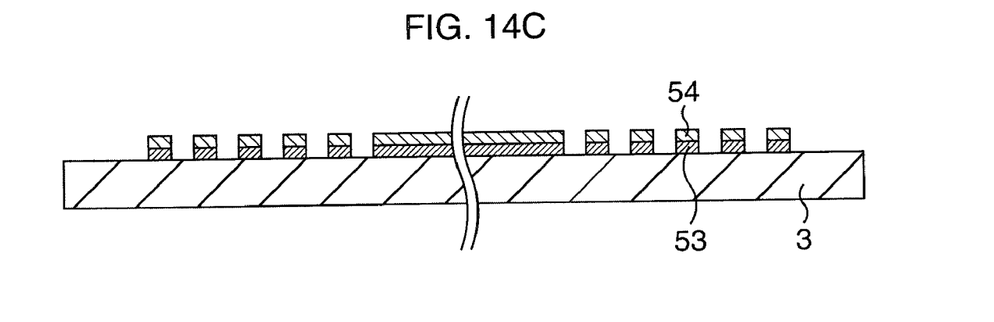
FIG. 14C is a schematic sectional view showing the manufacturing method of the reticle according to the modified example 3 in order of step following FIG. 14B.

Subsequently, the half tone film 53 is dry etched using the patterned chromium (Cr) film 54 as a mask, as shown in FIG. 14C.

Figure 14D:
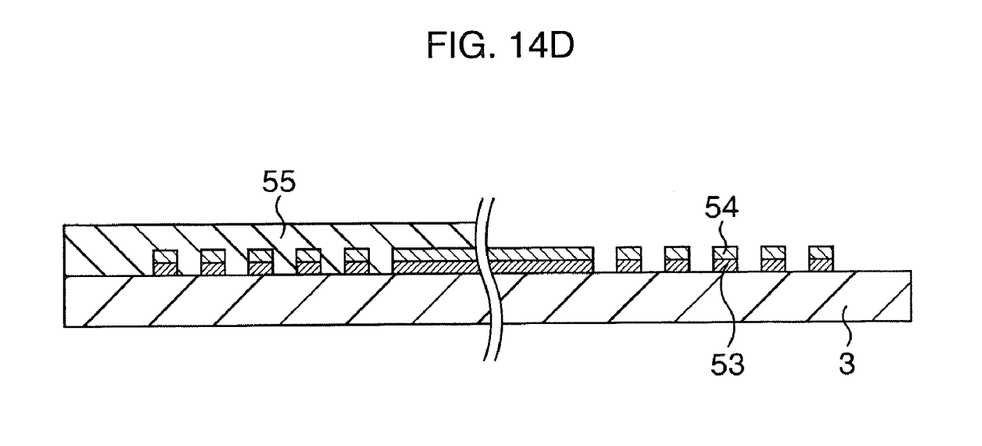
FIG. 14D is a schematic sectional view showing the manufacturing method of the reticle according to the modified example 3 in order of step following FIG. 14C.

Followingly, a resist is applied to the half tone film 53, as shown in FIG. 14D. The resist is processed by lithography using a second exposure data to form a resist pattern 55 so as to cover portions (not shown) on the half tone film 53 where the chromium (Cr) film 54 is necessary to be remained thereon and the monitor pattern region 2. Here, generally, when forming the half tone type phase shift mask, there almost always exists portions on the half tone film where the chromium (Cr) film has to be remained thereon. Therefore, normally, a resist pattern covering only the necessary portions is formed using the second exposure data. In the present embodiment, when forming the resist pattern, it is only needed to change the second exposure data to make the resist cover the necessary portions as well as the monitor pattern region 2.

Figure 14E:
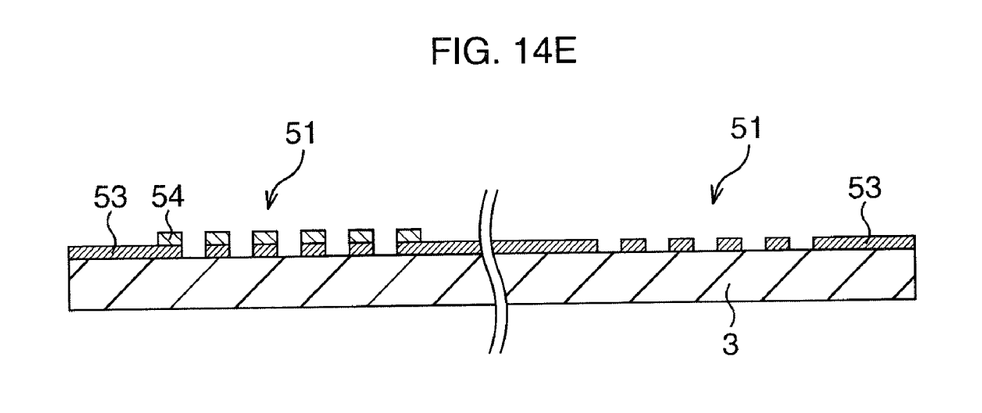
FIG. 14E is a schematic sectional view showing the manufacturing method of the reticle according to the modified example 3 in order of step following FIG. 14D.

Next, the main pattern region 1 and the chromium (Cr) film 54 on the portions (not shown) where the chromium (Cr) film 54 does not have to be remained thereon are removed using the resist pattern 55 as a mask, as shown in FIG. 14E. Thereafter, the resist pattern 55 is removed by ashing treatment and the like. At this time, a main pattern 51 composed of the half tone film 53 is completed in the main pattern region 1, and a monitor pattern 52 composed of the half tone film 53 and the chromium (Cr) film 54 is completed in the monitor pattern region 2.

According to the modified example 3, it is enabled to measure the focus error amount and positive/negative direction of the focus easily with high accuracy. Further, by reflecting the resulting focus error to a next lot or a next process, a fine pattern can be formed with high accuracy.

Further, when leaving the chromium (Cr) film 54 in the monitor pattern region 2, the only needed is to change the second exposure data, so that the monitor pattern 52 can be formed easily without increasing a number of processes.

Another Embodiment Adopting the Present Invention

The respective means constituting the focus error measuring apparatus (except for the size measurer), the focus error measuring method, and the respective steps (step S1 to step S3 in FIG. 7, step S11 to step S15 in FIG. 8, or the like) of the semiconductor device manufacturing method according to the above-described embodiment and its various modified examples can be realized by operating the program stored in a RAM, a ROM and the like of a computer. The program and the computer-readable recording medium in which the program is stored are within the scope of the present invention.

Concretely, the above-described program is stored in a recording medium such as a CD-ROM, or provided into a computer via various transmitting media. As a recording medium storing the program, a flexible disc, a hard disc, a magnetic tape, an optical magnetic tape, a nonvolatile memory card, and the like can be employed, in addition to the CD-ROM. Meanwhile, as a transmitting medium of the program, a communication medium (a wired circuit such as an optical fiber, or the like, a wireless circuit, and the like) in a computer network (a LAN, a WAN such as an Internet, a wireless communication network, or the like) system for supplying a program information by propagating the information as a carrier wave are usable.

Further, in addition to the case where a function of the above-described embodiment is realized by executing the supplied program by the computer, those cases where the program cooperated with an OS (operating system), the other application software, or the like, that are operating in the computer to realize the function of the embodiment, and where all or parts of the supplied program are performed by a function expansion board or a function expansion unit of the computer to thereby realize the function of the embodiment are also within the scope of the present invention.

Figure 15:
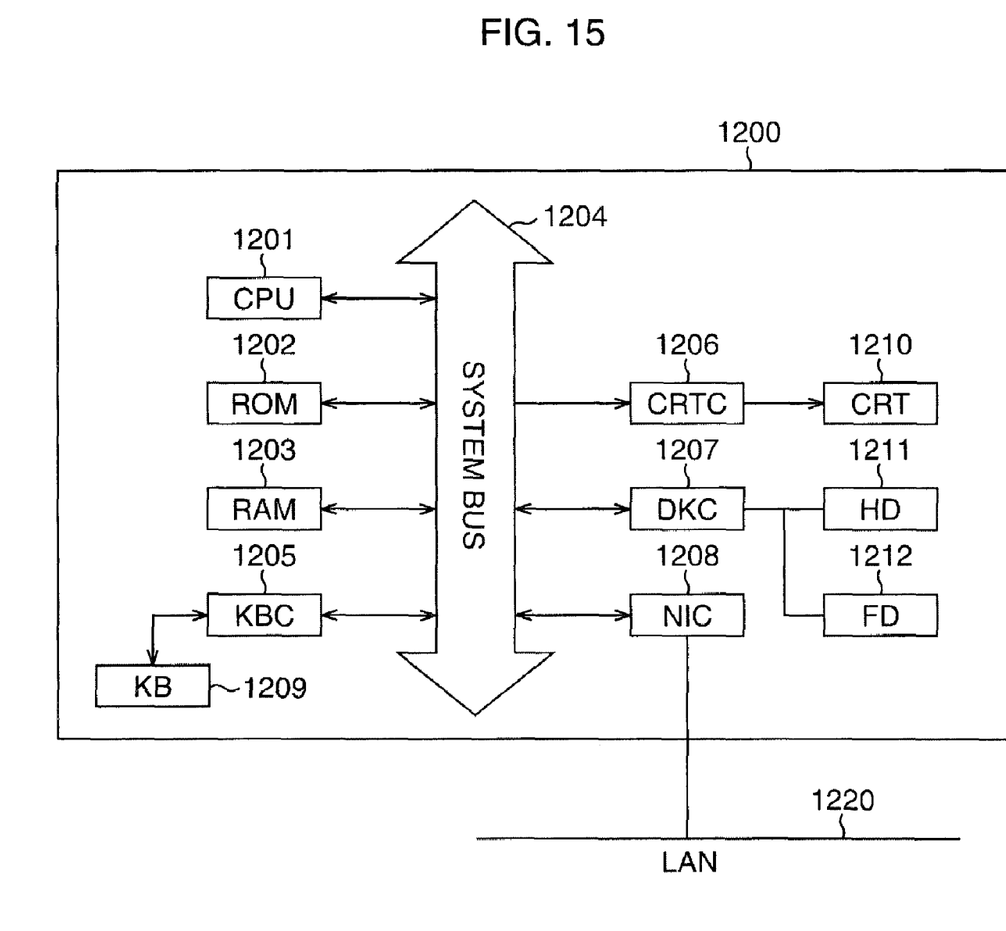
FIG. 15 is a schematic diagram showing an internal configuration of a terminal equipment for an individual user.

For instance, FIG. 15 is a schematic view showing an internal configuration of a terminal equipment for an individual user. In FIG. 15, "1200" denotes a computer PC. The PC 1200 includes a CPU 1201 and executes a device control software stored in a ROM 1202 or a hard disc (HD) 1211, or supplied by a flexible disc drive (FD) 1212, to thereby control respective devices connected to a system bus 1204 comprehensively.

The processes of steps S1 to S3 in FIG. 7, the processes of steps S11 to S15 in FIG. 8 and so forth of the embodiment can be realized by the program stored in the CPU 1201 of the PC 1200, the ROM 1202 or the hard disk (HD) 1211.

"1203" denotes a RAM that functions as a main memory, a work area and the like of the CPU 1201. "1205" denotes a keyboard controller (KBC) to control instruction input from a keyboard (KB) 1209, not-illustrated device and the like.

"1206" denotes a CRT controller (CRTC) to control display on a CRT display (CRT) 1210. "1207" denotes a disk controller (DKC) to control the access with the hard disk (HD) 1211 and the flexible disk (FD) 1212 for storing a boot program (program for starting execution (operation) of hardware and software of the personal computer), plural applications, an edition file, a user file, a network control program and the like.

"1208" denotes a network interface card (NIC) to bidirectionally transfer data to and from a network printer, other network units, or other PCs through a LAN 1220.

For purposes of explanation, in the above description, numerous specific details are set forth in order to provide a thorough understanding of the invention. It will be apparent, however, to one skilled in the art that the invention can be practiced without these specific details. In other instances, well-known structures and devices are shown in block diagram form in order to avoid obscuring the invention.

While the invention has been described in conjunction with the specific embodiments thereof, it is evident that many alternatives, modifications, and variations will be apparent to those skilled in the art. Accordingly, embodiments of the invention, as set forth herein, are intended to be illustrative, not limiting. There are changes that may be made without departing from the spirit and scope of the invention.

What is claimed is:

1. A pattern transfer mask comprising:
    a main pattern region including a main pattern configured with at least one first recess and to be transfer-formed on a transfer object; and
    a monitor pattern region at a location different from the main pattern region and including a monitor pattern configured with at least one second recess and being used for calculating a focus variation amount when the main pattern is transfer-formed,
    wherein the at least one first recess and the at least one second recess have different longitudinal dimensions, and
    wherein the longitudinal dimension of the main pattern is smaller than the longitudinal dimension of the monitor pattern.

2. The pattern transfer mask according to claim 1, further comprising:
    a substrate;
    a film formed on the substrate;
    wherein the main pattern and the monitor pattern are formed by processing the film; and
    wherein a thickness of the film of the main pattern and a thickness of the film of the monitor pattern are different.

3. The pattern transfer mask according to claim 1, further comprising:
    a substrate;
    a film formed on the substrate;
    wherein the main pattern and the monitor pattern are formed by processing the substrate and the film; and
    wherein the longitudinal dimensions of the main pattern and the monitor pattern are equal to a thickness of the film and a depth of the substrate, the main pattern and monitor pattern having different depth values.

4. The pattern transfer mask according to claim 1, further comprising:
    a substrate;
    a film formed on the substrate;
    wherein the main pattern and the monitor pattern are formed by processing the film; and
    wherein the film of the main pattern and film of the monitor pattern are different due to a light-shielding film remaining on the film during processing in either one of said main pattern region or said monitor pattern region.

5. The pattern transfer mask according to claim 1, wherein the monitor pattern is a light-shielding pattern.

6. A pattern transfer mask comprising:
a transparent substrate having a flat surface;
a light-shielding object formed over the transparent substrate;
a main pattern region including a main pattern to be transfer-formed on a transfer object; and
a monitor pattern region including a monitor pattern for calculating a focus variation amount when the main pattern is transfer-formed,
wherein the main pattern is composed of the light-shielding object formed in the main pattern region and the monitor pattern is composed of the light-shielding object formed in the monitor pattern region, and a longitudinal dimension of the main pattern from the flat surface of the transparent substrate is different from a longitudinal dimension of the monitor pattern from the flat surface of the transparent substrate.

* * * * *